United States Patent
Soejima et al.

(10) Patent No.: US 7,528,068 B2
(45) Date of Patent: May 5, 2009

(54) METHOD FOR MANUFACTURING SEMICONDUCTOR DEVICE

(75) Inventors: Koji Soejima, Kanagawa (JP); Masaya Kawano, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 424 days.

(21) Appl. No.: 11/085,135

(22) Filed: Mar. 22, 2005

(65) Prior Publication Data

US 2005/0233581 A1 Oct. 20, 2005

(30) Foreign Application Priority Data

Mar. 31, 2004 (JP) ............................. 2004-108442

(51) Int. Cl.
*H01L 21/44* (2006.01)
(52) U.S. Cl. ........................ 438/667; 438/675
(58) Field of Classification Search ................ 438/622, 438/106, 667, 675; 257/261, 678, 690, 621
See application file for complete search history.

(56) References Cited

U.S. PATENT DOCUMENTS

| | | | | | |
|---|---|---|---|---|---|
| 3,911,475 | A | * | 10/1975 | Szedon et al. ............... | 257/786 |
| 5,990,007 | A | * | 11/1999 | Kajita et al. ................ | 438/680 |
| 6,008,114 | A | * | 12/1999 | Li ............................... | 438/618 |
| 6,078,057 | A | * | 6/2000 | Vallett ......................... | 257/48 |
| 6,462,395 | B1 | * | 10/2002 | Fukuda et al. .............. | 257/520 |
| 6,690,044 | B1 | * | 2/2004 | Doan et al. .................. | 257/258 |
| 2001/0005046 | A1 | * | 6/2001 | Hsuan et al. ................. | 257/686 |
| 2004/0043607 | A1 | * | 3/2004 | Farnworth et al. .......... | 438/667 |
| 2005/0247967 | A1 | * | 11/2005 | Green et al. ................ | 257/303 |
| 2006/0231927 | A1 | * | 10/2006 | Ohno ......................... | 257/621 |

FOREIGN PATENT DOCUMENTS

JP 2000-311982 11/2000

* cited by examiner

*Primary Examiner*—Zandra V. Smith
*Assistant Examiner*—Colleen E Rodgers
(74) *Attorney, Agent, or Firm*—McGinn IP Law Group, PLLC

(57) ABSTRACT

A semiconductor device has through electrodes with property as an electrode and excellent in manufacturing stability. The through electrode composed of a conductive small diameter plug and a conductive large diameter plug is provided on the semiconductor device. A cross sectional area of the small diameter plug is made larger than a cross sectional area of a connection plug and its diameter each, and the cross sectional area of the small diameter plug is made smaller than a cross sectional area of the large diameter plug and its diameter each. Further, a projecting portion where the small diameter plug is projected from a silicon substrate is put into an upper face of the large diameter plug. Further, an upper face of the small diameter plug is connected to a first interconnect.

20 Claims, 7 Drawing Sheets

SECTIONAL VIEW

PLAN VIEW

SECTIONAL VIEW

PLAN VIEW

SECTIONAL VIEW

PLAN VIEW

METHOD FOR MANUFACTURING SEMICONDUCTOR DEVICE

This application is based on Japanese patent application NO. 2004-108442, the content of which is incorporated hereinto by reference.

BACKGROUND OF THE INVENTION

1. Field of the Invention

The present invention relates to a method for manufacturing a semiconductor device.

2. Related Art

In recent years a semiconductor device necessitates to be lightweight, thin, and short sized, and a high performance. In the semiconductor device such as a multi-chip package or the like, realizing high density interconnect, miniaturization of a logic chip and capacity increase of a memory is aggressively promoted.

As one corresponding means coping with such proposals, it is tried that realizing high density interconnect or the like is achieved upon providing a through electrode in a semiconductor substrate. For instance, the Japanese Laid-Open Patent Publication No. 2000-311982 discloses a conventional through electrode. The Japanese Laid-Open Patent Publication No. 2000-311982 discloses a semiconductor device. The semiconductor device has the through electrode in which a through hole is penetrated in a semiconductor chip substrate. An intermediate insulating layer is provided on an inner circumferential surface of the through hole, and a conductive layer is filled in the through hole inside the intermediate insulating layer. According to the Japanese Laid-Open Patent Publication No. 2000-311982, this configuration makes it possible to form plural semiconductor chip substrates three-dimensionally with high density.

SUMMARY OF THE INVENTION

On the other hand, the through electrode described in the Japanese Laid-Open Patent Publication No. 2000-311982 has a configuration in which a large through electrode is penetrated through the semiconductor chip substrate, so that it is not possible to provide interconnect or the like on a region at which the through electrode is formed. For this reason, it has now been discovered that integration density of the interconnect or the like decreases, therefore, there is still room for further improvement on realizing high density interconnect. There has been a concern that reliability of the element deteriorates at the time the through electrode is formed because the through electrode is formed after forming the element.

According to the present invention, there is provided a method for manufacturing a semiconductor device, comprising: forming a first hole at a side of a main face of a semiconductor substrate; forming a barrier film made of an insulating material on an inner wall of the first hole; forming a first plug in the inside portion of the first hole by embedding a first metal film in the inside portion of the first hole, wherein the first plug comprises first metal film and the barrier film; forming a second hole by selectively removing the semiconductor substrate from a side of a rear surface of the semiconductor substrate so as to expose a portion of the first plug in an inside portion of the second hole; adhering an insulating material selectively to a region other than the first plug exposed in the second hole; exposing the first metal film by removing at least portion of the exposed barrier film; and forming a second plug including a portion of the first plug by growing selectively a second metal film so as to embed the inside portion of the second hole.

In the present specification, a main face is of a face of a semiconductor substrate on which semiconductor elements are formed.

According to this method, it is possible to stably manufacture the semiconductor device with simple process that has a through electrode that is excellent in adhesion between the first plug and the second plug. Further, it is possible to manufacture the semiconductor device that is excellent in insulating property of the surface of the second plug with simple process.

In the present invention, the first plug includes the first metal film and the barrier film. Further, in the present invention, it may be suitable that the first metal film includes the barrier metal film.

In the method for manufacturing the semiconductor device of the present invention, forming the second plug may include growing the second metal film with the exposed first metal film as a starting point so as to embed the inside potion of the second hole. Having such process, it is possible to cause a metal to grow further surely in the second hole.

In the method for manufacturing the semiconductor device of the present invention, the insulating material may be an electrodeposited material. Therefore, it causes the insulating material to adhere to a region except for the first plug of an inner face of the second hole with further high selectivity.

In the method for manufacturing the semiconductor device of the present invention, the electrodeposited material may be an electrodeposited polyimide. Therefore, it is possible to enhance resistance of the insulating material to processing in this process and afterward. Consequently, it is possible to stably manufacture the semiconductor device with further high yield.

In the method for manufacturing the semiconductor device of the present invention, a cross section area of the second hole may be larger than a cross section area of the first hole. Therefore, the cross sectional area of the first plug is capable of being made smaller than the cross sectional area of the second plug. Consequently, it is possible to include surely a portion of the first plug in the inside of the second plug. Further, it is possible to stably manufacture the semiconductor device with the high integration interconnect.

In the method for manufacturing the semiconductor device of the present invention, the method may comprise forming a metal seed layer on the inner face of the second hole before the forming the second plug; and wherein the forming the second plug includes growing the second metal film with the metal seed layer as the starting point. By causing the metal film to grow with the seed layer as the starting point, it is possible to further surely embed the metal film in the inside of the second hole.

In the method for manufacturing the semiconductor device of the present invention, the method may comprise forming a metal seed layer selectively on the region except for the first plug of the inner face of the second hole, after the forming the second hole and before the adhering the insulating material; and wherein the adhering the insulating material includes adhering the insulating material on the seed layer. Having such process, it is possible to further stably adhere the insulating material to a region except for the first plug of the inner face of the second hole.

In the method for manufacturing the semiconductor device of the present invention, the method may comprise forming an insulating film on the main face of the semiconductor substrate; and wherein the forming the first hole includes removing selectively the insulating film of a region forming the first hole, after forming the insulating film. Having such process, it is possible to stably obtain the semiconductor device with a configuration in which the first plug is connected to the interconnect of the upper portion of the insulating film.

In the method for manufacturing the semiconductor device of the present invention, the method may comprise forming an interconnect layer on the insulating film of the semiconductor substrate after the forming the first plug; and wherein the forming the interconnect layer includes forming an interconnect connected to the first plug. Having such process, it is possible to enhance integration of the same layer interconnect as an interconnect connected to the first plug. For this reason, it is possible to stably manufacture the semiconductor device with high integration of the interconnect. Further, in the method for manufacturing the semiconductor device, the method may include forming an upper portion interconnect to connect to the interconnect, on the upper portion of the interconnect layer. Having such process, it is possible to stably manufacture a multilayered semiconductor device with upper portion interconnect of high integration that resides on the upper layer than the interconnect layer.

It should be noted that it is effective as the embodiment of the present invention even though these respective constitution are combined arbitrarily, or representation of the present invention is converted in connection with its method, device or the like.

For instance, according to the present invention, there is provided a semiconductor device comprising: a semiconductor substrate; an insulating layer provided on a main face of the semiconductor substrate; and a through electrode connecting with a conductive material provided on an inside of the insulating layer while penetrating the semiconductor substrate, wherein the through electrode has a first conductive plug connecting to the conductive material, and a second conductive plug including a portion of the first conductive plug, which is provided within the semiconductor substrate and has a cross sectional area larger than a cross sectional area of the first conductive plug.

In the semiconductor device of the present invention, a portion of the first conductive plug is included in the second conductive plug. For this reason, anchor effect is suitably obtained, and these plugs have excellent property in adhesion. Further, the configuration reduces contact resistance between these plugs. Further, the first plug with small cross sectional area is disposed at the side of the main face, therefore, it is possible to enhance integration of the interconnect in the vicinity of the through electrode. For this reason, the configuration is suitable for miniaturization.

Further, according to the present invention, there is provided a semiconductor device comprising: a semiconductor substrate; a transistor formation layer provided on a main face of the semiconductor substrate; an interconnect layer provided on an upper portion of the transistor formation layer; an upper portion interconnect layer provided on an upper portion of the interconnect layer; and a through electrode penetrating through the transistor formation layer and the semiconductor substrate, wherein the through electrode, which is provided on the transistor formation layer, comprises a first plug connecting an interconnect formed within the interconnect layer, and a second plug, which is formed within the semiconductor substrate and has a cross section area larger than a cross section area of the first conductive plug, connecting to the first plug.

In the semiconductor device of the present invention, the first conductive plug is connected to the interconnect layer coated with the upper portion interconnect layer. Further, a configuration is that the cross sectional area of the first conductive plug is smaller than the cross sectional area of the second conductive plug. For this reason, the configuration makes it possible to enhance integration of the interconnect or the elements in the interconnect layer or in its upper layer. Therefore, the semiconductor device of the present invention has a configuration suitable for miniaturization.

In the semiconductor device of the present invention, it is possible to adopt a configuration that the second conductive plug is connected to the semiconductor substrate via an insulating film. Therefore, the configuration may be realized as a configuration that is excellent in manufacturing stability. Further, it is possible to decrease a parasitic capacitance. For instance, in the present invention, the insulating film may be formed with an electrodeposited insulating film.

Further, in the present invention, embedding the first metal film may include forming a barrier metal film on an inner wall of the first hole. Further, in the present invention, the first metal film may be set to as a multilayered film including the barrier metal film. Therefore, it is possible to further surely suppress diffusion of the conductive material composing the first plug toward the semiconductor substrate.

As described above according to the present invention, there is provided the semiconductor device having the through electrode that is excellent in property as the electrode and manufacturing stability. Further, it is possible to make the interconnect of the semiconductor device to be high density.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
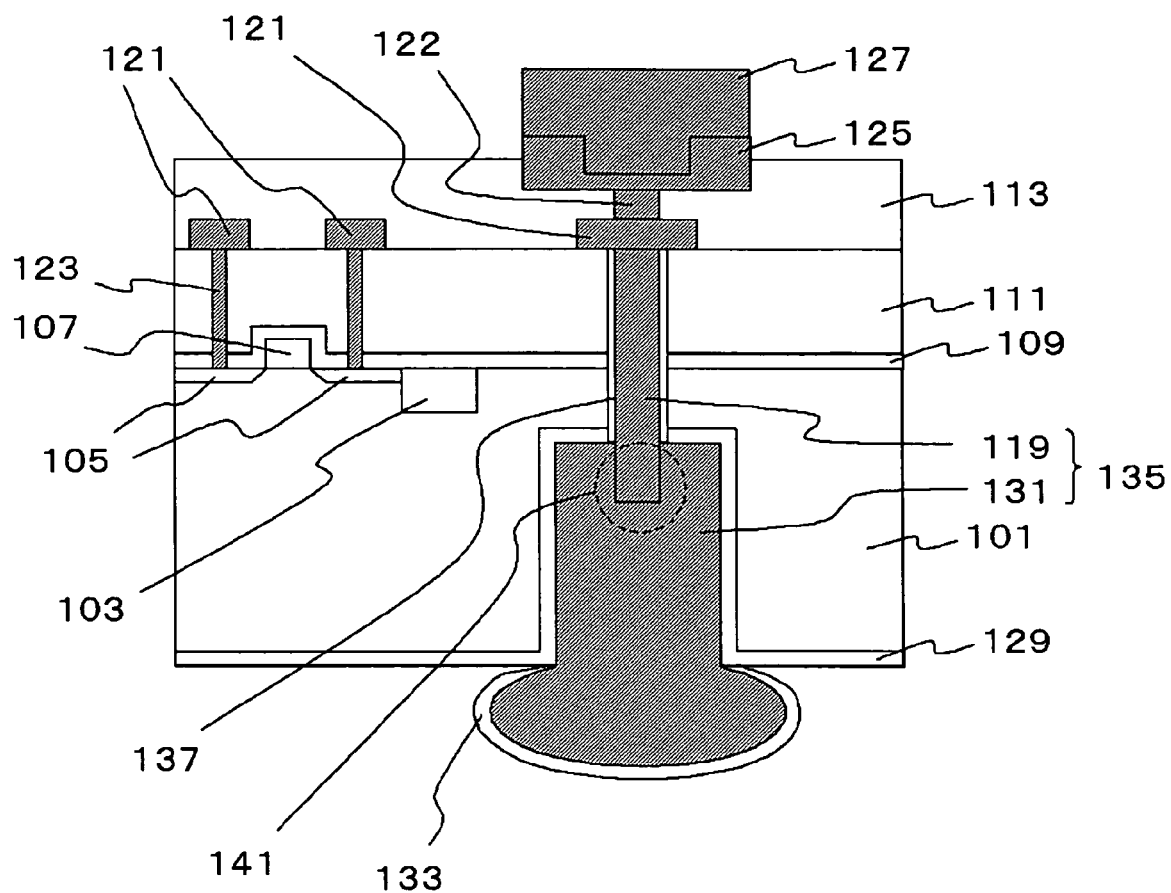
FIG. 1 is a sectional view schematically showing a configuration of a semiconductor device according to the present embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described an embodiment of the present invention while referring to the drawings. In the whole drawings, the same symbol is attached to the common component, and detailed description will be omitted appropriately in the following explanation. Further, in the following embodiments, a main face side of the semiconductor substrate is set to an upper (front surface) side of the semiconductor device, and a rear surface side of the semiconductor substrate is set to a lower (rear surface) side of the semiconductor device.

FIRST EMBODIMENT

FIG. 1 is a sectional view schematically showing a configuration of a semiconductor device according to the present embodiment. The semiconductor device 100 shown in FIG. 1 has a multilayered structure formed by a silicon substrate 101, an etching stopper film 109, a lowermost-layer insulating film 111 and a first interconnect layer insulating film 113, and is provided with a through electrode 135 penetrating the silicon substrate 101, the etching stopper film 109 and the lowermost-layer insulating film 111.

A MOS transistor composed of a diffusion layer 105, a gate electrode 107 and the like and an isolation film 103 are formed on a main face of the silicon substrate 101. The lowermost-layer insulating film 111 is formed so as to embed the MOS transistor and the isolation film 103. The etching stopper film 109 is provided in the lowermost-layer insulating film 111 in contact with an upper face of the silicon substrate 101 and the gate electrode 107. Further, also a connection plug 123 connected to the diffusion layer 105 is provided in the lowermost-layer insulating film 111.

There is provided a first interconnect 121 and a connection plug 122 connected electrically to the first interconnect 121 in the first interconnect layer insulating film 113. Further, a pad 125 connected electrically to the connection plug 122 and a bump 127 connected electrically to the pad 125 are formed in this order on an upper portion of the connection plug 122.

The through electrode 135 has a conductive small diameter plug 119 and a conductive large diameter plug 131. The respective cross sectional area and the diameter of the small diameter plug 119 are larger than the cross sectional area and the diameter of the connection plug 123, and smaller than the cross sectional area and the diameter of the large diameter plug 131. Further, a projecting portion 141, in which the small diameter plug 119 projects from the silicon substrate 101, is put into an upper face of the large diameter plug 131.

A diameter of the small diameter plug 119 is capable of being set to degree of, for instance, 1 to 5 μm. Further, the small diameter plug 119 is can be set to a configuration where the small diameter plug 119 is put into the silicon substrate 101 in the degree of 20 to 50 μm. Further, length of the projecting portion 141 put into the large diameter plug 131 is set to, for instance, degree of 1 to 50 μm. In addition, diameter of the large diameter plug 131 is set to, for instance, degree of 10 to 1000 μm.

The small diameter plug 119 penetrates the etching stopper film 109 and the silicon substrate 101 in this order from the upper face of the lowermost-layer insulating film 111, so that a top end thereof, which is exposed to the outer portion of the silicon substrate 101, becomes a projecting portion 141. The upper face of the small diameter plug 119 comes into contact with the first interconnect 121, which has a bottom face within the same flat face as a bottom face of the first interconnect layer insulating film 113, so that electrical connection therebetween is secured. A side face of the small diameter plug 119 is coated with a SiN film 137 except for the projecting portion 141.

Further, the large diameter plug 131 is formed toward the main face from the rear surface of the silicon substrate 101. The upper face of the large diameter plug 131 is located at the lower portion than the upper face of the silicon substrate 101.

There is provided an electrodeposited insulating film 129 on the bottom face and the side face of the large diameter plug 131, and on the rear surface of the silicon substrate 101. Further, a surface of the large diameter plug 131 is coated with a plating film 133.

Although a material of the small diameter plug 119 is not particularly limited, it is possible to use, for instance, W (tungsten). In such a way as above, diffusing for the silicon substrate 101 is suitably suppressed. In addition, although a material for the large diameter plug 131 and the plating film 133 are not particularly limited, but the materials can be respectively set to, for instance, Ni and Au.

Next, there will be described a method for manufacturing the semiconductor device 100. FIGS. 2A to 2D are sectional views schematically showing the manufacturing process of the semiconductor device 100 shown in FIG. 1.

First, the gate electrode 107, the diffusion layer 105 and the isolation film 103 are formed on the silicon substrate 101. The isolation film 103 is set to for instance, STI (shallow trench isolation). After that, the etching stopper film 109 and the lowermost-layer insulating film 111 are formed in this order on the entire surface of the upper face of the silicon substrate 101.

At this time, as the etching stopper film 109, for instance, a SiN film of 50 nm is formed by plasma CVD technique. Further, as the lowermost-layer insulating film 111, for instance, $SiO_2$ film of 400 nm is formed by plasma CVD technique. Or, as the lowermost-layer insulating film 111, it may be formed the multilayered film in such a way that a L-Ox™ film of 300 nm to be a low dielectric constant interlayer insulating film is formed by an application technique, and a $SiO_2$ film of 100 nm is formed on an upper face of the L-Ox™ film.

Next, an antireflection film and a photoresist are applied in this order on the lowermost-layer insulating film 111, upon using photolithography technique, resulting in forming a resist pattern (not shown in the drawings) having an opening corresponding to a shape of the small diameter plug 119. A position where the small diameter plug 119 should be provided is opened while performing dry etching the lowermost-layer insulating film 111 with the photoresist film as the mask. And, etching back of the etching stopper film 109 is performed by dry-etching.

After that, there is further performed etching to the middle portion of the silicon substrate 101 while changing etching gas. For instance, there is performed etching to the depth of not less than 10 μm to not more than 50 μm from the upper face of the silicon substrate 101. By making the depth not less than 10 μm, it is possible to connect surely periphery of the projecting portion 141 with the large diameter plug 131. Further, by making the depth not more than 50 μm, it is possible to reduce amount of projection of the small diameter plug 119 to an inner portion of the silicon substrate 101 from the main face of the silicon substrate 101. For this reason, it is possible to form an opening stably. The diameter of the opening is selected such that the diameter of the small diameter plug 119 becomes, for instance, degree of 1 to 5 μm. And then, residue of the photoresist film or the antireflection film or residue caused by etching is removed.

Next, a SiN film 137 of 20 nm is formed on the entire surface of the upper face of the silicon substrate 101 on which there is provided the opening corresponding to the shape of the small diameter plug 119.

And, a resist pattern (not shown in the drawings) with the opening, which opens corresponding to the shape of the connection plug 123, using the photolithography technique is formed upon applying newly an antireflection film and the photoresist on the lowermost-layer insulating film 111. At a position where the connection plug 123 on the diffusion layer 105 is provided, an opening is formed by performing dry etching the lowermost-layer insulating film 111 with the photoresist film as the mask. And, etching back of the etching stopper film 109 is performed with dry-etching to expose the upper face of the diffusion layer 105. Thus the holes to form the small diameter plug 119 and the connection plug 123 are obtained.

Figure 2A:
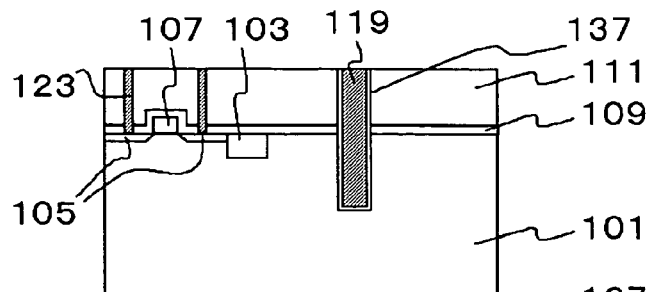
FIGS. 2A to 2D are sectional views schematically explaining manufacturing process of the semiconductor device of FIG. 1.

Next, W (tungsten) film as metal film is formed by CVD technique on the entire surface of the upper face of the silicon substrate 101. The film thickness of the W (tungsten) film is set to the film thickness in a state where, by matching to the diameter of both of the connection plug 123 and the small diameter plug 119, the both can be embedded therein. For instance, the film thickness of W (tungsten) is set to degree of 1 μm. Then, W (tungsten) film on the lowermost-layer insulating film 111 and the SiN film 137 are removed by CMP (Chemical Mechanical polishing). Thus, the small diameter plug 119 and the connection plug 123 are formed simultaneously (FIG. 2A).

Figure 2B:
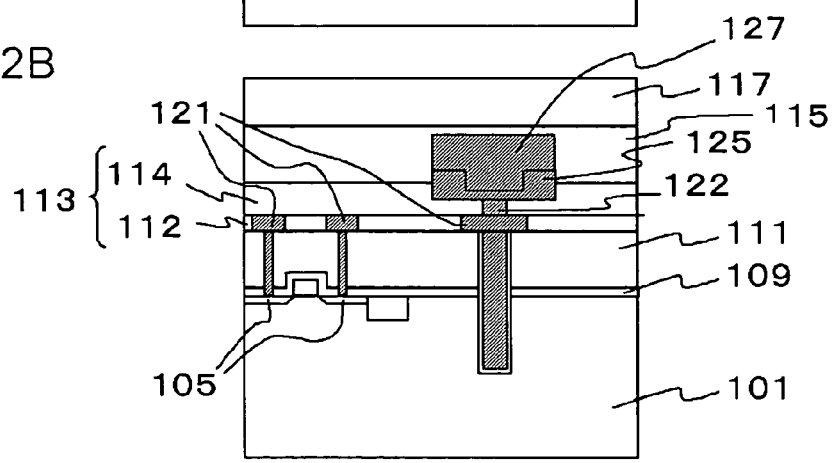

Next, the first interconnect layer insulating film 113 is provided on the entire surface of the upper face of the silicon substrate 101. The first interconnect layer insulating film 113, as shown in FIG. 2B, adopts a configuration in which an insulating film for interconnect 112 and an insulating film for plug 114 are formed.

First, the insulating film for interconnect 112 of 300 nm to be an under layer of the first interconnect layer insulating film 113 is formed by coating the entire surface of the upper face of the silicon substrate 101. The insulating film for interconnect 112 may be set a low dielectric constant film such as L-Ox™ or the like. At this time, it may be suitable that there is provided a SiCN film that is a as Cu diffusion stopper film on the lowermost-layer insulating film 111. Further, it may be suitable that a SiO$_2$ film of 100 nm is formed on the low dielectric constant film. Next, an antireflection film and a photoresist are applied on the entire surface of the upper face of the silicon substrate 101, upon using photolithography technique, resulting in forming a resist pattern for trench interconnect on the photoresist. Then, an opening for manufacturing the first interconnect 121 is formed by performing etching the insulating film for interconnect 112 with the photoresist as a mask. Next, the photoresist and the antireflection film are stripped by ashing.

After that, by using sputtering technique, a TaN film of 30 nm as a barrier metal film is formed, and a Cu film of 100 nm for a seed is formed on the TaN film. Next, a Cu film of 700 nm is formed by electrolytic plating technique, subsequently a metal film to become the first interconnect 121 is formed by CMP technique. After that, just as the small diameter plug 119 and the connection plug 123 are formed, the first interconnect 121 is formed while removing the Cu film and the barrier metal film on the insulating film for interconnect 112.

After that, the insulating film for plug 114 constituting an upper layer of the first interconnect layer insulating film 113 is formed on the insulating film for interconnect 112 by usual interconnect manufacturing process. The connection plug 122 to be connected to the first interconnect 121 is formed in the insulating film for plug 114. Then, a pad 125 connected to the connection plug 122 and a bump 127 are formed in this order. Material of the pad 125 may be, for instance, Al, Cu, Ni, TiN, or the like. Further, material of the bump 127 is capable of being set to, for instance, Au, solder, or the like.

There may be further formed upper layer of the predetermined number of interconnect layer or the like on the upper portion of the first interconnect layer insulating film 113.

Next, an adhesive layer 115 is formed on the upper face of the silicon substrate 101 to attach a supporting component 117 (FIG. 2B). For instance, an adhesive tape is used as the adhesive layer 115. The adhesive tape is composed of a base material and an adhesive layer formed on its both sides. As the base material composing the adhesive tape, for instance, polyolefin resin, polyester resin or the like is used. As the adhesive composing the adhesive tape, for instance, an acrylic emulsion adhesive, an acrylic solvent adhesive, a polyurethane adhesive or the like is used.

Further, materials of the supporting component 117 may be materials provided with durability to heat, agent, external force or the like in the process of thinning processing or the like of the silicon substrate 101 by grinding the rear face described later, thus the materials may be, for instance, glass of quarts, Pyrex™ or the like. Further, it may be materials other than glass. For instance, materials of plastics or the like such as acrylic resin and so forth may be used.

Next, grinding a rear surface of the silicon substrate 101 is performed. The grinding a rear surface is performed by mechanical polishing technique. Although a thickness of the silicon substrate 101 after grinding is may be appropriately selected within the range that a bottom portion of the small diameter plug 119 is not exposed; for instance, the thickness can be degree of 50 to 200 μm. Then, the antireflection film and the photoresist are formed in this order on the rear surface of the silicon substrate 101; and the resist pattern (not shown in the drawings) is formed in which an opening to form the large diameter plug 131 is provided, by using the photolithography technique. The silicon substrate 101 is dry-etched with the photoresist as the mask, after that, the opening 139 is provided at the position where the large diameter plug 131 should be provided.

The opening 139 has a shape, in which, the opening 139 is headed toward the main face from the rear surface of the silicon substrate 101, an upper face of the opening 139 is located in lower portion than vicinity of the main face of the silicon substrate 101. Further, the opening 139 is provided on a bottom portion of the projecting portion 141, and the upper face of the opening 139 is located at an upper portion than the bottom face of the small diameter plug 119. The SiN film 137 is provided on the surface of the small diameter plug 119. Etching conditions at the time dry etching of silicon substrate 101 is performed are the conditions where selectivity ratio between a silicon film and the SiN film 137 is set to high condition, therefore, when the opening 139 is formed, the small diameter plug 119 is not removed, but the silicon substrate 101 of side face outer periphery of the small diameter plug 119 is selectively removed. Owing to this, the opening 139 is formed with a shape including the bottom face of the small diameter plug 119. Further, a portion of the small diameter plug 119 is exposed to outside of the silicon substrate 101, thus the projecting portion 141 is formed.

Figure 2C:
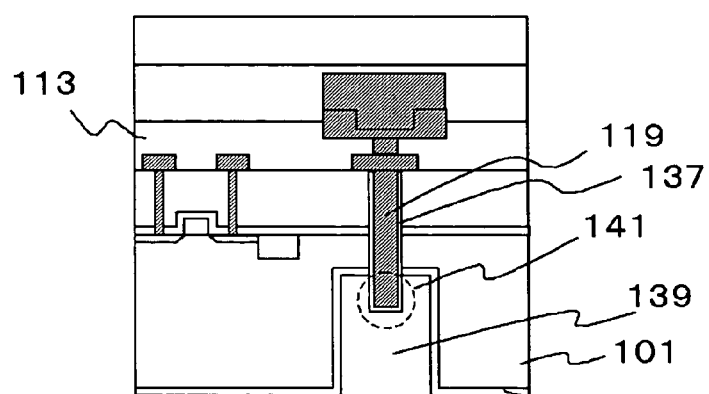

Next, an electrodeposited insulating film 129 is provided on the rear surface of the silicon substrate 101 (FIG. 2C). At this time, the electrodeposited insulating film 129 is selectively formed on the rear surface of the silicon substrate 101, and the bottom face and side face of the opening 139. The surface of the projecting portion 141 is coated with the insulative SiN film 137, so that the electrodeposited insulating film 129 is not formed at outer side of the small diameter plug 119. The film thickness of the electrodeposited insulating film 129 is, for instance, degree of 0.5 to 5 μm.

The electrodeposited insulating film 129 is, for instance, an electrodeposited polyimide film. It is possible to use cationic electrodeposited polyimide coating or anionic electrodeposited polyimide coating as materials of the electrodeposited polyimide film. Specifically, for instance, Elecoat PI manufactured by Shimizu corp. or the like may be used. The material of the electrodeposited insulating film 129 is not limited to polyimide, also it may be used another electrodeposited polymer coatings such as an epoxy containing electrodeposited coating, an acrylic containing electrodeposited coating, fluorine containing electrodeposited coating or the like. Heat resistance of the electrodeposited insulating film 129 can be improved upon using the polyimide as the material of the electrodeposition insulating film 129. For this reason, deterioration after manufacturing process is appropriately suppressed, so that it is possible to realize configuration in which stable manufacture with a high yield is achieved.

Formation of the electrodeposited insulating film 129 is performed in such a way as, for instance, following process. The silicon substrate 101 is one side of electrode, and one side of electrode and another side counter electrode are dipped within the liquid of an electrodeposited coating. Then, predetermined potential is applied to the silicon substrate 101 and another side electrode depending on electric charge of the polymer. Having such process, the polymer adheres on the surface of the silicon substrate 101. If the predetermined film thickness is obtained, the silicon substrate 101 is taken out from the coating to wash it in water. After that, the electrodeposition insulating film 129 is formed on the rear surface upon baking the silicon substrate 101.

Next, the etching back the SiN film 137 is performed. Herewith, the SiN film 137 is removed at a top end of the projecting portion 141 to expose the surface of the small diameter plug 119. At this time, the electrodeposited insulating film 129 is formed on the rear surface of the silicon substrate 101, therefore, the silicon substrate is not removed, but the SiN film 137 is selectively removed. Although, in FIG. 1 and FIG. 2D, a configuration in which the whole SiN film 137 in the projecting portion 141 is removed is exemplified, it may be suitable that at least portion including plug bottom portion of the small diameter plug 119 is exposed.

Figure 2D:
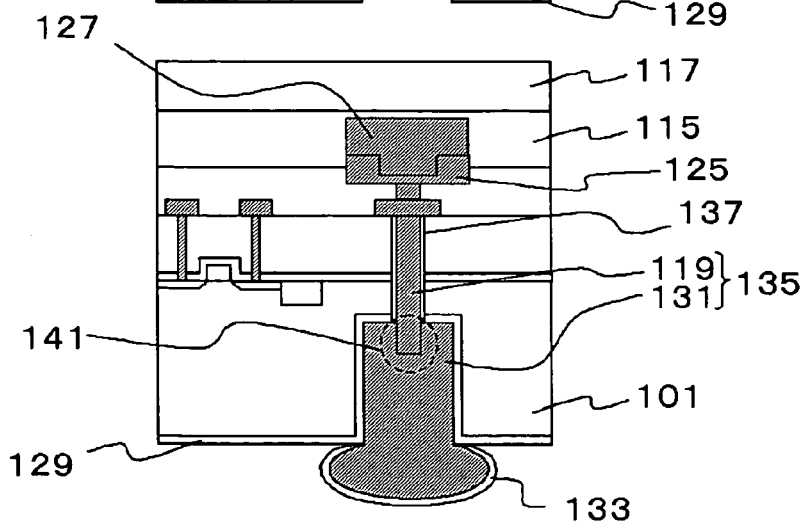

Subsequently, through the electroless plating, the Ni film is grown with the exposed portion of the small diameter plug 119 as the starting point, the opening 139 is embedded and the bump is integrally formed at the outside of the opening 139. Then, the large diameter plug 131 is formed upon providing an Au plating film 133 on the surface of the bump (FIG. 2D).

At this time, formation of the large diameter plug 131 may be performed in such a way as to separate into two processes of embedding process of the opening 139 of the rear surface and bump forming process of the rear surface.

After that, upon removing the adhesive layer 115 from the main face of the silicon substrate 101, the supporting component is removed, and the semiconductor device 100 shown in FIG. 1 is obtained.

Next, there will be described the effect of the semiconductor device 100 shown in FIG. 1.

First, in the semiconductor device 100, the through electrode 135 is composed of two plugs of the small diameter plug 119 and the large diameter plug 131. The projecting portion 141 at the end portion of the small diameter plug 119 is included in the large diameter plug 131.

Figure 3A:
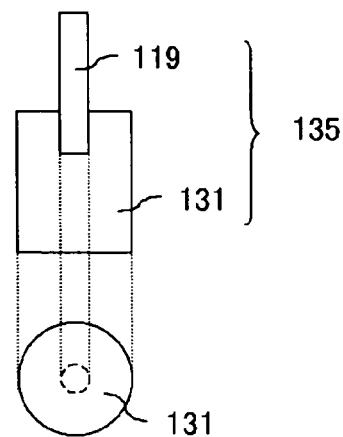
FIGS. 3A to 3C are views schematically showing configuration of a through electrode.
Figure 3B:
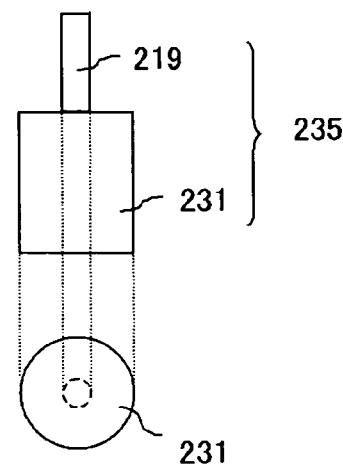

FIG. 3A and FIG. 3B are views schematically showing configuration of the through electrode composed of two plugs with different thickness. In respective partial drawings, upper view is a sectional view, and lower view is a plan view. FIG. 3A is a view showing configuration of the through electrode 135 according to the present embodiment. Further, FIG. 3B is a view showing the through electrode 235 of the shape in which the small diameter plug 219 and the large diameter plug 231 are connected in the plane surface.

In the configuration of FIG. 3A, improvement of adhesion of both plugs by an anchor effect is aimed. For this reason, the through electrode may have a bonded configuration as compared to the case shown in FIG. 3B where these end portions are only in contact with each other. Further, selective growing from the rear surface of the silicon substrate 101 makes it possible to form the large diameter plug 131. For this reason, the configuration makes it possible to simplify manufacturing process. Further, reduction of contact resistance between both plugs is achieved based on this configuration. Further, it is possible to reduce electrical resistance by increasing diameter of the plug other than vicinity of the interconnect, while securing sufficiently interconnect density by minimizing diameter of the plug in the vicinity of the interconnect. For this reason, it is possible to improve electrical characteristics of the semiconductor device 100.

Figure 3C:
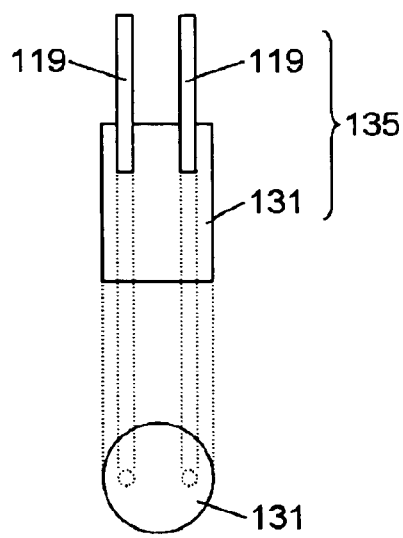

Further, as shown in FIG. 3C, in such configuration that the through electrode 135 is composed of three plugs of the large diameter plug 131, and two small diameter plugs 119 included in the large diameter plug 131 according to the present embodiment, adhesion of the plug based on the anchor effect is further improved, and more reduction of the contact resistance is achieved.

It is not necessary for the small diameter plug 119 to penetrate until the rear surface side of the large diameter plug 131. Since depth of the projecting portion 141 may be shallow, manufacturing of the small diameter plug 119 by embedding may be stably performed.

Further, in the through electrode 135, the diameter of the small diameter plug 119 is smaller than the diameter of the large diameter plug 131. For this reason, it is possible to minimize the size of the first interconnect 121 electrically connecting to the small diameter plug 119. Further, this configuration may improve integration of elements in the lowermost-layer insulating film 111. Consequently, this configuration is appropriate configuration for miniaturization of the whole device.

Further, since the small diameter plug 119 may be formed at the same time the connection plug 123 is formed, the configuration makes it possible to simplify the manufacturing process and to reduce the manufacturing cost accompanied therewith. Further, the influence of formation of the small diameter plug 119 on formation process of the transistor is small, thus formation of the through electrode 135 gives a little damages to the transistor.

Further, in the upper portion of the through electrode 135, the small diameter plug 119 is connected to the first interconnect 121 within the first interconnect layer insulating film 113 to be the lowermost-layer interconnect, so that the configuration causes the through electrode 135 not to project to the first interconnect layer insulating film 113. For this reason, this configuration may improve the interconnect density in the first interconnect layer insulating film 113. Consequently, influence of arrangement of the through electrode 135 on configuration of the circuit is small, so that the semiconductor device 100 has the freedom of selection with respect to elements or interconnect arrangement, and further makes it possible to reduce dead space of the first interconnect layer insulating film 113 and to enhance integration of the first interconnect 121.

Further, in the semiconductor device 100, there is selectively provided the electrodeposited insulating film 129 at the region other than the surface of the projecting portion 141 of the inner surface of the opening 139. For this reason, in the process after forming the large diameter plug 131, it is possible to use the electrodeposited insulating film 129 as the protective film. Further, since it is not necessary to form the resist pattern for formation of the large diameter plug 131 on the rear surface of the silicon substrate 101, the configuration makes it possible to manufacture the large diameter plug 131 stably in the simple process.

Figure 4A:
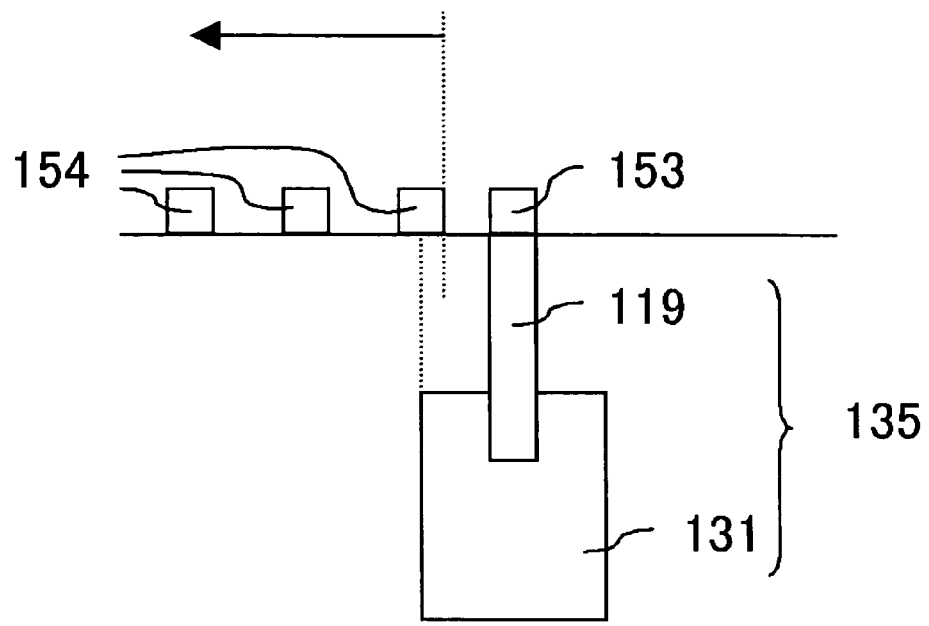
FIGS. 4A and 4B are sectional views schematically showing configuration of the through electrode.
Figure 4B:
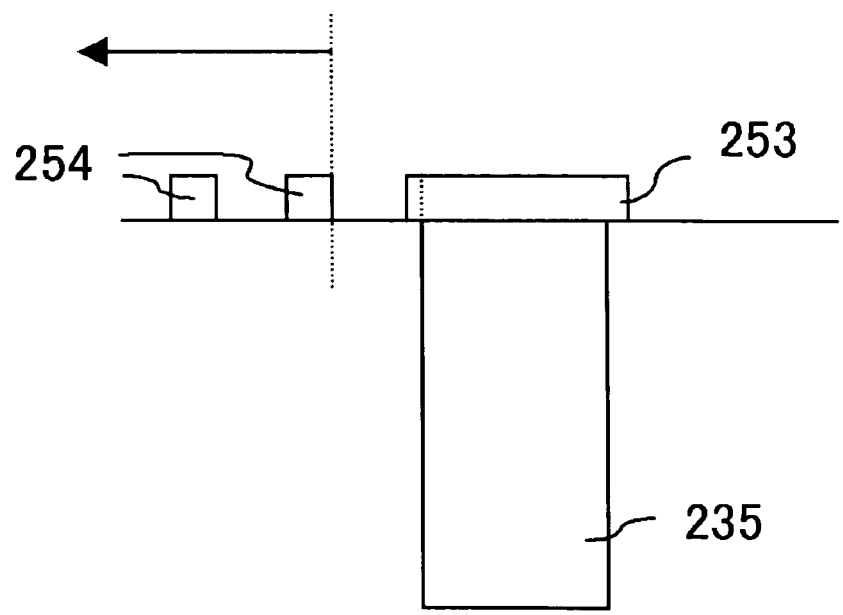

Next, configuration of the through electrode 135 composed of the small diameter plug 119 and the large diameter plug 131 is further described as compared with configuration of the conventional through electrode. FIGS. 4A and 4B are sectional views schematically showing configuration of the through electrode. FIG. 4A is a view schematically showing configuration of the through electrode 135 according to the present embodiment. Further, FIG. 4B is a view schematically showing configuration of the conventional through electrode 235.

As shown in FIG. 4B, the conventional through electrode 235 is composed of one large plug, and comes into contact with the interconnect 153 on its upper face. For this reason, the conventional through electrode has tendency that the area of the interconnect 253 on the upper portion of the through electrode 235 becomes relatively large. Further, in the layer of the interconnect 253 coming into contact with the through electrode 235, an interconnect 254 except for the interconnect 253 coming into contact with the through electrode 235 cannot be provided in the vicinity of the through electrode 235. For this reason, as indicated by the arrow in the drawing, it has been possible to form the interconnect 254 other than the interconnect 253 coming into contact with the through electrode 235, only within the region distant from the upper face of the through electrode 235 and its vicinity. Consequently, there is still room for further improvement relative to enhancement of integration of the interconnect 254 other than the interconnect 253 coming into contact with the through electrode 235.

On the contrary, as shown in FIG. 4A, in the through electrode 135 according to the present embodiment, the through electrode 135 comes into contact with the interconnect 153 on the upper face of the small diameter plug 119. For this reason, it is possible to minimize the cross sectional area of the interconnect 153 on the upper portion of the small diameter plug 119. Further, the plug connecting to the interconnect 153 is of the small diameter plug 119. For this reason, as indicated by the arrow in the drawing, the region where the interconnect 154 other than the interconnect 153 coming into contact with the small diameter plug 119 can be formed is wide. Therefore, it is possible to enhance integration of the interconnect 154 other than the interconnect 153 coming into contact with the small diameter 119. Further, it is possible to reduce electrical resistance by increasing diameter of the plug other than vicinity of the interconnect layer, while securing sufficiently interconnect density by minimizing diameter of the plug in the vicinity of the interconnect layer.

Further, as described previously while using FIG. 3A and FIG. 3B, through electrode 135 in FIG. 4A has the configuration that a portion of the small diameter plug 119 is put into the large diameter plug 131. For this reason, even though two plugs are used, different from configuration of FIG. 4B, contact resistance between these plugs is sufficiently small as compared to configuration of FIG. 3B, thus the configuration has excellent characteristics as the through electrode.

Although there is not shown in FIG. 1, in the semiconductor device 100, configuration of the upper layer of the first interconnect layer insulating film 113 can be selected appropriately depending on designing of the device. An interconnect layer or the like may be further formed on the upper portion of the first interconnect layer insulating film 113.

Figure 5:
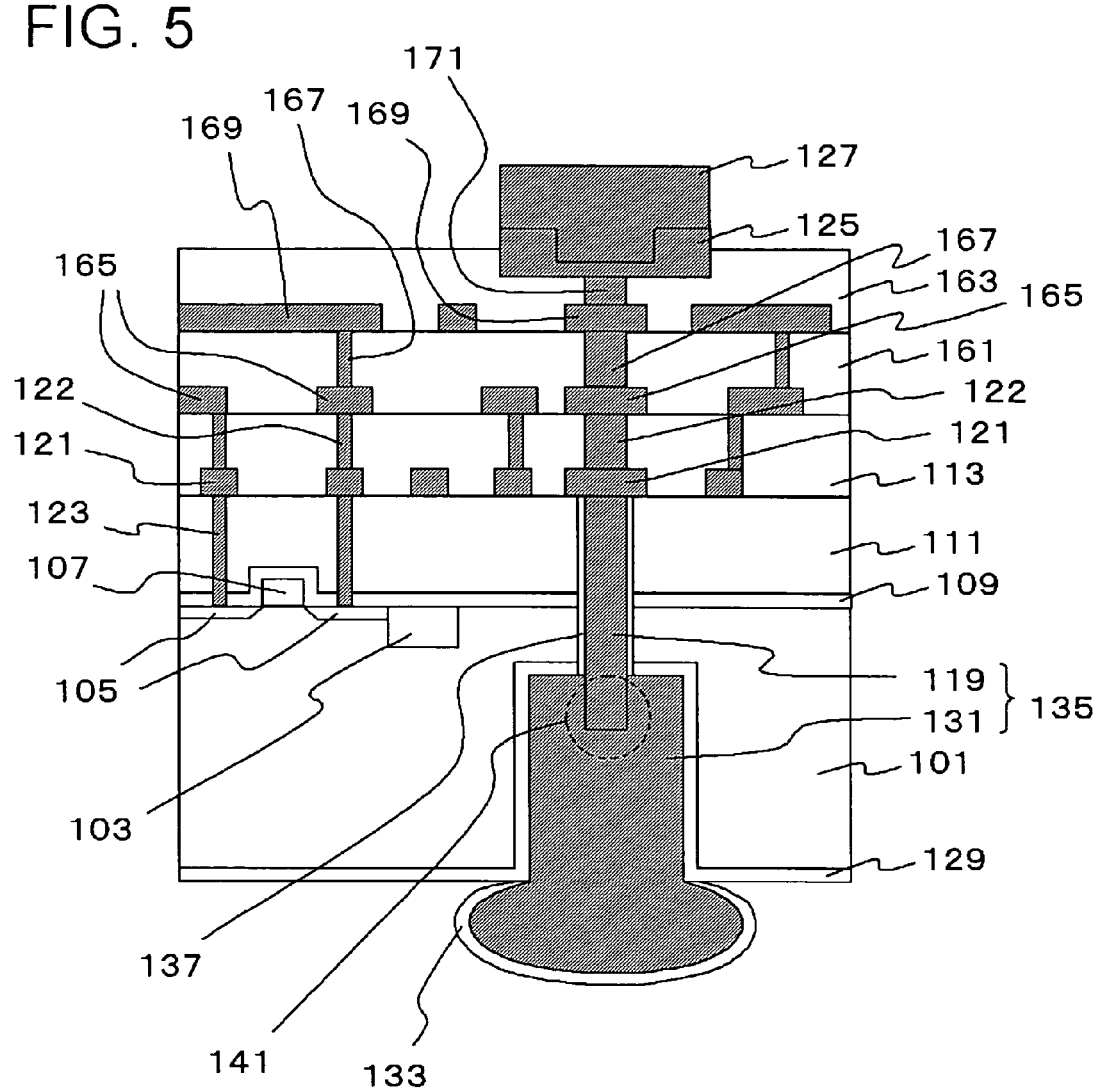
FIG. 5 is a sectional view schematically showing a configuration of the semiconductor device according to the present embodiment.

For instance, FIG. 5 is a sectional view schematically showing configuration of the semiconductor device in which interconnect layers are formed. Although configuration of the semiconductor device in FIG. 5 is the same as the semiconductor device 100 shown in FIG. 1 approximately; there are formed a lowermost-layer insulating film 111, the first interconnect layer insulating film 113 on the silicon substrate 101, and in addition thereto, an insulating layer 161 and an insulating layer 163 are further formed on the silicon substrate 101. An interconnect 165 and a connection plug 167 are formed in the insulating layer 161. An interconnect 169 and a connection plug 171 are formed in the insulating layer 163.

As shown in FIG. 5, in the through electrode 135 according to the present embodiment, there is provided the small diameter plug 119 with small cross sectional area at the main face side, and the small diameter plug 119 is connected to the first interconnect 121 provided at lower layer in a layered component. For this reason, it is possible to enhance integration of the interconnect of the upper layer.

Figure 6:
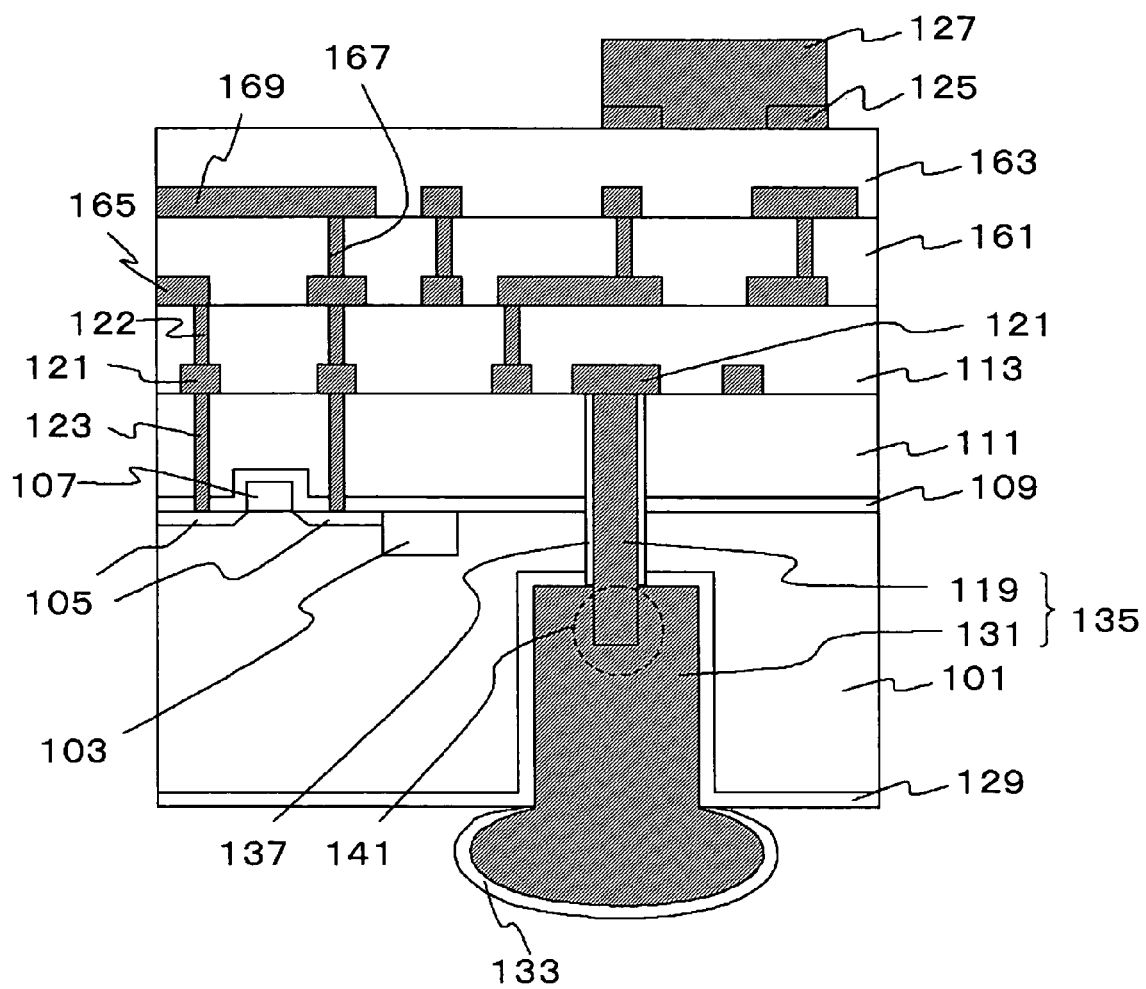
FIG. 6 is a sectional view schematically showing a configuration of the semiconductor device according to the present embodiment.

Further, FIG. 6 is a sectional view schematically showing another configuration of the semiconductor device in which interconnect layers are formed. As shown in FIG. 6, the small diameter plug 119 is connected to the first interconnect 121, therefore, this configuration is excellent in the freedom of design of the upper layer than the first interconnect 121. For instance, this makes it possible to bring configuration in which the through electrode 135 is not connected to the bump 127, or to bring configuration in which the through electrode 135 is connected to the bump 127 through an interconnect, which is not shown in the drawing, without forming the bump 127 just above the through electrode 135 or the like.

Figure 7A:
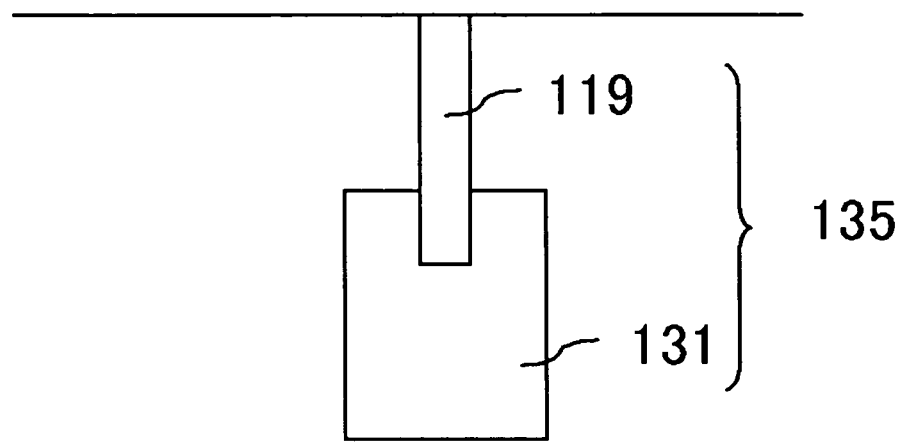
FIGS. 7A and 7B are sectional views schematically showing configuration of the through electrode according to the present embodiment.
Figure 7B:
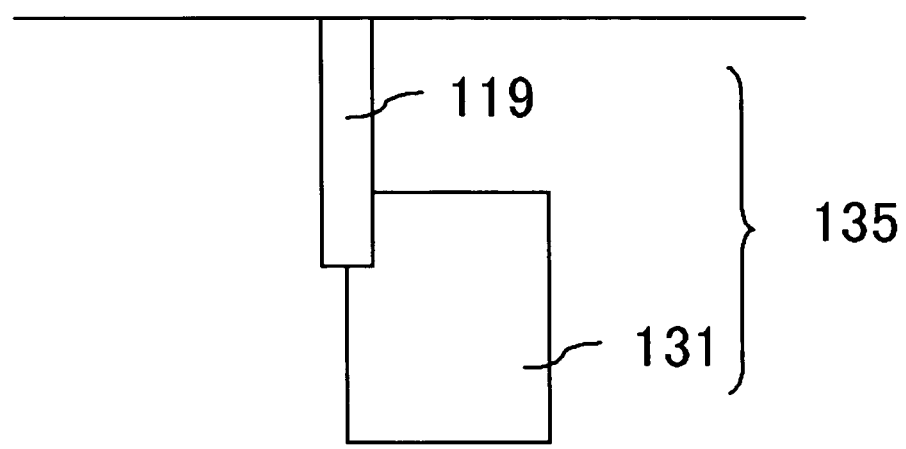

Further, in the semiconductor device according to the present embodiment and the following embodiment, as a mode in which portion of the small diameter plug 119 composing the through electrode 135 is included in the large diameter plug 131, for instance, a mode in which portion of cross section of the small diameter plug 119 is included and a mode in which the whole cross section is included are indicated. FIGS. 7A and 7B are cross sectional views schematically showing such configuration of the through electrode 135. FIG. 7A is a view showing configuration in which the whole of cross section of the small diameter plug 119 is included in the large diameter plug 131. Further, FIG. 7B is a view showing configuration in which portion of the cross section of the small diameter plug 119 is included in the large diameter plug 131. The shape of concave portion formed on the large diameter plug 131 is different depending on a manner in a state where the small diameter plug 119 is included.

As shown in FIGS. 7A and 7B, configuration in which the small diameter 119 comes into contact with the large diameter plug 131 with the plurality of faces thereof can be obtained, upon having configuration in which at least portion of cross section of the small diameter plug 119 is included in the large diameter plug 131. For this reason, it is possible to improve adhesion between the small diameter plug 119 and the large diameter plug 131 as compared with configuration described above by using FIG. 3B. Further, as shown in FIG. 7A, it is possible to further improve adhesion between the both components by adopting configuration in which the whole cross section of the small diameter plug 119 is put into the large diameter plug 131 to be included therein.

SECOND EMBODIMENT

It is also possible to manufacture the semiconductor device 100 described in the first embodiment in such a way as the following process. Hereinafter, there will be described the embodiment about the point different from the first embodiment while referring to FIG. 2A to FIG. 2D.

First, like the first embodiment, process until providing the electrodeposited insulating film 129 on the rear surface of the silicon substrate 101 is performed (FIG. 2C). Next, in the same process as the first embodiment, the etching back of the SiN film 137 in the projecting portion 141 is performed.

Then, a metal seed layer is formed on the entire rear surface of the silicon substrate 101 on which the electrodeposited insulating film 129 is provided. The metal composing the seed layer may be, for instance, Ni, Ni/Cu, or TiN/Ti/Cu or the like. When using a plurality of metals in the seed layer, these are indicated in such a way as being "lower layer/upper layer" or "lower layer/intermediate layer/upper layer" in the order of nearer layer from the silicon substrate 101. In addition, the seed layer may be formed by sputtering technique.

Next, a resist pattern where a region other than the opening 139 is opened is formed, while coating the opening 139, on the rear surface of the silicon substrate 101. Then, the seed layer is partially removed by performing etching. And then, the resist pattern provided on the rear surface of the silicon substrate 101 is removed. Having such process, the seed layer coating inner face of the opening 139 is formed.

Then, electrolytic plating of Ni is performed, and further plating film 133 of Au is provided on the surface, thus, the large diameter plug 131 is obtained. Having such process, the semiconductor device according to the present embodiment is obtained.

In the semiconductor device according to the present embodiment, the seed layer is formed on the entire face of the inner wall of the opening 139. For this reason, the configuration makes it possible to form stably the large diameter plug 131 with no gap in the opening 139. Further, since the seed layer is provided, it is possible to appropriately reduce the contact resistance between the small diameter plug 119 and the large diameter plug 131. Therefore, the configuration has further excellent conductivity of the through electrode 135. For this reason, the through electrode 135 has further excellent configuration in reliability. Further, the configuration is excellent in manufacturing stability.

THIRD EMBODIMENT

It is also possible to manufacture the semiconductor device 100 described in the first embodiment in such a way as the following process. Hereinafter, there will be described the present embodiment about the point different from the first embodiment or the second embodiment while referring to FIG. 2A to FIG. 2D.

First, like the first embodiment and the second embodiment, the process described above using FIG. 2A and FIG. 2B is performed. The adhesive layer 115 is formed on the upper face of the silicon substrate 101, followed by adhering it to the supporting component 117 (FIG. 2B). After that, process until grinding the rear surface of the silicon substrate 101, and formation of the opening 139 is performed.

Next, the seed layer is provided on the rear surface of the silicon substrate 101, before performing process providing the electrodeposited insulating film 129 on the rear surface of the silicon substrate 101 (FIG. 2C). The material of the seed layer is material with lower resistance than Si. For instance, the material of the seed layer is metal such as Ni or the like. The film thickness of the seed layer can be, for instance, degree of 0.1 to 2 μm.

The seed layer can be formed by, for instance, the electroless plating technique. It is possible to selectively form the seed layer relative to the SiN film 137 on the rear surface of the silicon substrate 101 due to use of the electroless plating technique.

After forming the seed layer, with the seed layer as the seed, like the first embodiment, the electrodeposited insulating film 129 is provided on the rear surface of the silicon substrate 101 (FIG. 2C, provided that the seed layer is not shown in the drawing). Like the first embodiment or the second embodiment, later processes can be performed. Thus, the semiconductor device according to the present embodiment can be obtained.

In the semiconductor device according to the present embodiment, the seed layer is formed on the entire rear surface of the silicon substrate 101 including an inner wall of the opening 139. It is possible to stably form the electrodeposited insulating film 129 evenly, by providing metal seed layer with lower resistance than Si as the foundation layer. Consequently, the configuration makes it possible to further stably manufacture the large diameter plug 131 without forming the resist pattern for forming the large diameter plug 131 on the rear surface of the silicon substrate 101. Further, it is possible to insulate surely between the large diameter plug 131 and the silicon substrate 101.

As above, there have been described embodiments of the invention. However, of course, the present invention is not limited to the above described embodiments, and the person skilled in the art is capable of changing the above described embodiment within the scope of the present invention.

For instance, in the embodiment described above, the silicon substrate is used as the semiconductor substrate, however, a compound semiconductor substrate such as GaAs substrate or the like may be used.

Further, in the above described embodiment, W (tungsten) is used as the material of the small diameter plug 119, however, another metal with high conductivity may be used. For instance, metals such as Cu, Al, Ni or the like may be used.

Further, in the above described embodiment, there has been described configuration in which the small diameter plug 119 composing the through electrode 135 is connected to the first interconnect layer insulating film 113, however, there may be adopted configuration, in which the small diameter plug is connected to a lower layered interconnect layer disposed at position which is upper than the first interconnect layer insulating film 113 and is upper than the first interconnect layer.

Further, in the embodiment described above, there has been exemplified configuration in which one small diameter plug 119 is put into the upper face of one large diameter plug 131, however, as shown in FIG. 3C, a configuration in which more than two small diameter plugs 119 are put into one large diameter plug 131 may be possible. Having such configuration, this makes it possible to be further reliable electrical contact between the small diameter plug 119 and the large diameter plug 131.

Further, there has been exemplified the case where both the small diameter plug 119 and the large diameter plug 131 composing the through electrode 135 are cylinders, however, if the small diameter plug 119 is a columnar body put into the large diameter plug 131, these shapes are not limited to the cylinders. For instance, shape of the small diameter plug 119 or the large diameter plug 131 may suitably be a shape in which area of an upper face and bottom face are approximately identical such as elliptical cylinder or square column or the like. Further, shape of the small diameter plug 119 or the large diameter plug 131 may suitably be a shape of frustum of circular cone, frustum of elliptical cone, or frustum of pyramid with no top end on an upper face. Further, the columnar body may suitably be a trench shape extending in one direction.

Further, in the embodiment described above, there has been exemplified configuration in which the upper face of the large diameter plug 131 is located at lower portion of the main face of the silicon substrate 101, however, it may be possible to adopt configuration making it possible to provide the large diameter plug 131 across vicinity of the main face from the rear surface of the silicon substrate 101. Further, even though the upper face of the large diameter plug 131 is somewhat protruded from the main face of the silicon substrate 101, it may be suitable if the upper face of the large diameter plug 131 is insulated.

Further, in the embodiment described above, the adhesive layer 115 and the supporting member 117 are separated from the main surface of the silicon substrate 101, however, these remain as they are as needed, and they may be portion of the semiconductor device.

It is apparent that the present invention is not limited to the above embodiment that modified and changed without departing from the scope and sprit of the invention.

What is claimed is:

1. A method for manufacturing a semiconductor device, comprising:
    forming a first hole at a side of a main face of a semiconductor substrate;
    forming a barrier film made of an insulating material on an inner wall of said first hole;
    forming a first plug in said inside portion of said first hole by embedding a first metal film in said inside portion of said first hole, wherein said first plug comprises first metal film and said barrier film;
    forming a second hole by selectively removing said semiconductor substrate from a side of a rear surface of said semiconductor substrate so as to expose a portion of said first plug in an inside portion of said second hole;
    adhering an insulating material selectively to a region other than said first plug exposed in said second hole;
    exposing at least a portion of said first metal film of the side surface of said first plug by removing at least a portion of the exposed barrier film; and
    forming a second plug including a portion of said first plug by growing selectively a second metal film to fill said inside portion of said second hole,
    wherein said side surface of said first plug contacts with said second metal film and said first plug protrudes into said second hole.

2. The method for manufacturing the semiconductor device according to claim 1, wherein said forming said second plug includes growing said second metal film with said exposed first metal film as a starting point so as to fill said inside potion of said second hole.

3. The method for manufacturing the semiconductor device according to claim 1, wherein said insulating material is of an electrodeposited material.

4. The method for manufacturing the semiconductor device according to claim 3, wherein said electrodeposited material is of an electrodeposited polyimide.

5. The method for manufacturing the semiconductor device according to claim 1, wherein a cross section area of said second hole is larger than a cross section area of said first hole.

6. The method for manufacturing the semiconductor device according to claim 1, further comprising:
    forming a metal seed layer on said inner face of said second hole before said forming said second plug; and
    wherein said forming said second plug includes growing said second metal film with said metal seed layer as the starting point.

7. The method for manufacturing the semiconductor device according to claim 1, further comprising:
    forming a metal seed layer selectively on said region except for said first plug of said inner face of said second hole, after said forming said second hole and before said adhering said insulating material.

8. The method for manufacturing the semiconductor device according to claim 1, further comprising:
    forming an insulating film on said main face of said semiconductor substrate; and
    wherein said forming said first hole includes removing selectively said insulating film from a region where said first hole is to be formed, after forming said insulating film.

9. The method for manufacturing the semiconductor device according to claim 8, further comprising:
    forming an interconnect layer on said insulating film of said semiconductor substrate after said forming said first plug; and
    wherein said forming said interconnect layer includes forming an interconnect connected to said first plug.

10. The method for manufacturing the semiconductor device according to claim 1, wherein said barrier film covers an entirety of the inner wall of said first hole.

11. The method for manufacturing the semiconductor device according to claim 1, wherein said first hole is formed to a depth of not less than 10 μm to not more than 50 μm from the main face of said semiconductor substrate.

12. The method for manufacturing the semiconductor device according to claim 1, wherein said second plug comprises a first portion embedding said second hole and a second portion formed outside of said second hole.

13. The method for manufacturing the semiconductor device according to claim 12, wherein said second portion is coated with a plating film.

14. The method for manufacturing the semiconductor device according to claim 1, further comprising forming a MOS transistor on said semiconductor substrate.

15. The method for manufacturing the semiconductor device according to claim 1, further comprising forming a first interconnect on said semiconductor substrate.

16. The method for manufacturing the semiconductor device according to claim 15, further comprising forming a connection plug for connecting said first interconnect to a MOS transistor formed on said semiconductor substrate.

17. The method for manufacturing the semiconductor device according to claim 16, wherein said connection plug and said first plug are formed simultaneously.

18. The method for manufacturing the semiconductor device according to claim 15, wherein said first interconnect is formed in a insulating film layer and said first interconnect is connected to said first plug so that said first plug does not project into the insulating film layer.

19. The method for manufacturing the semiconductor device according to claim 1, wherein said first plug exposed in said second hole is devoid of insulating material.

20. A method for manufacturing a semiconductor device, comprising:
    forming a first hole in a semiconductor substrate;
    forming an insulating material on an inner wall of said first hole;
    forming a first plug in said first hole by filling said first hole with a first metal film;

forming a second hole by selectively removing a portion of said semiconductor substrate to expose a portion of said first plug in an inside portion of said second hole;

adhering an insulating material selectively to a region other than said first plug exposed in said second hole;

exposing at least a portion of said first metal film of the side surface of said first plug by removing at least a portion of the insulating material; and forming a second plug including a portion of said first plug by filling said inside portion of said second hole with a second metal film, wherein said side surface of said first plug contacts with said second metal film and said first plug protrudes into said second hole.

* * * * *